(12) United States Patent
Chen et al.

(10) Patent No.: US 7,125,805 B2
(45) Date of Patent: Oct. 24, 2006

(54) METHOD OF SEMICONDUCTOR FABRICATION INCORPORATING DISPOSABLE SPACER INTO ELEVATED SOURCE/DRAIN PROCESSING

(75) Inventors: Jian Chen, Austin, TX (US); Rode R. Mora, Austin, TX (US); Marc A. Rossow, Austin, TX (US); Yasuhito Shiho, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 76 days.

(21) Appl. No.: 10/839,385

(22) Filed: May 5, 2004

(65) Prior Publication Data

US 2005/0250287 A1 Nov. 10, 2005

(51) Int. Cl.
*H01L 21/336* (2006.01)
*H01L 21/311* (2006.01)
*H01L 21/31* (2006.01)
*H01L 21/469* (2006.01)

(52) U.S. Cl. .................. 438/696; 438/300; 438/778
(58) Field of Classification Search ............... 438/300, 438/696, 778; 257/E21.626, 900
See application file for complete search history.

(56) References Cited

U.S. PATENT DOCUMENTS 5,847,428 A * 12/1998 Fulford et al. ............ 257/344
2003/0015762 A1 1/2003 Lee et al.
2004/0137672 A1 * 7/2004 Lee et al. ................. 438/183
2005/0048732 A1 * 3/2005 Park et al. ................ 438/305

OTHER PUBLICATIONS

Wolf et al. Silicon Processing for the VLSI Era, vol. 1, 2nd Edition, Lattice Press, 2000, pp. 834-836.*
van Meer et al.; 70nm Fully-Depleted SOI CMOS Using a New Fabrication Scheme: The Spacer/Replacer Scheme; VLSI 2002.
Chau et al.; A 50nm Depleted-Substrate CMOS Transistor (DST); IEDM 2001.
Stanley Wolf, Ph.D., Richard N. Tauber Ph.D., Silicon Processing For The VLSI Era, vol. 1: Process Technology, Second Edition, 2000, pp. 834-836.

* cited by examiner

*Primary Examiner*—Carl Whitehead, Jr.
*Assistant Examiner*—Heather Doty

(57) ABSTRACT

A semiconductor fabrication process includes forming a gate electrode overlying a substrate. A first silicon nitride spacer is formed adjacent the gate electrode sidewalls and a disposable silicon nitride spacer is then formed adjacent the offset spacer. An elevated source/drain structure, defined by the boundaries of the disposable spacer, is then formed epitaxially. The disposable spacer is then removed to expose the substrate proximal to the gate electrode and a shallow implant, such as a halo or extension implant, is introduced into the exposed substrate proximal the gate electrode. A replacement spacer is formed substantially where the disposable spacer existed a source/drain implant is done to introduce a source/drain impurity distribution into the elevated source drain. The gate electrode may include an overlying silicon nitride capping layer and the first silicon nitride spacer may contact the capping layer to surround the polysilicon gate electrode in silicon nitride.

12 Claims, 4 Drawing Sheets

METHOD OF SEMICONDUCTOR FABRICATION INCORPORATING DISPOSABLE SPACER INTO ELEVATED SOURCE/DRAIN PROCESSING

FIELD OF THE INVENTION

The invention is in the filed of semiconductor fabrication and more specifically in semiconductor fabrication processes employing elevated source/drain processing.

RELATED ART

In the field of semiconductor fabrication, the scaling of silicon film thickness in silicon-on-insulator (SOI) technology has necessitated the use of elevated source/drain structures. SOI wafers incorporate a shallow silicon region (in which transistor structures such as the transistor channel are located) overlying a buried, electrically insulating layer such as silicon dioxide. The shallow silicon layer may be too shallow to contain the transistor source/drain regions without exhibiting undesirable and performance limiting current crowding. Elevated source/drain structures alleviate this problem by providing a thicker silicon film where the source/drain regions are formed.

Generally, elevated source/drain structures are fabricated with a selective epitaxial process. The epitaxial process that forms the elevated source/drain regions, unfortunately, introduces an additional thermal cycle into the processing sequence. The additional thermal cycle has an undesirable impact on impurity distributions that have already been introduced into the wafer. In conventional processes, these impurity distributions may include the halo and extension impurity distributions that are well known in the filed of CMOS fabrication. Because it is generally highly desirable to minimize the depth of the halo and extension implant distributions, the additional thermal cycle represented by the epitaxial process is problematic.

Accordingly, it would be highly desirable to introduce a method of semiconductor fabrication that incorporates an elevated source/drain processing while simultaneously addressing issued associated with the resulting impact of existing impurity profiles within the wafer. It would be further desirable if the implemented solution were highly repeatable and reliable and if the implemented process did not have any adverse affect on other transistor structures such as the gate electrode.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Generally speaking, the present invention encompasses a semiconductor fabrication process, and the resulting transistor structure, in which a disposable spacer is used in conjunction with elevated source/drain processing to provide a reliable elevated source/drain process sequence. The use of an offset spacer in conjunction with a disposable spacer beneficially prevents the formation of unwanted structures, such as "mouse ears" on the gate electrode, during the elevated source/drain formation sequence while still enabling the introduction of shallow implants after the elevated source/drain formation. In one implementation, a silicon nitride offset spacer is used to prevent formation of so-called "mouse ears" at the corners of the transistor gate electrode during epitaxial processing of the elevated source/drain. By preventing the formation of unwanted structures, the fabrication process of the present invention beneficially more reliable and reproducible.

Figure 1:
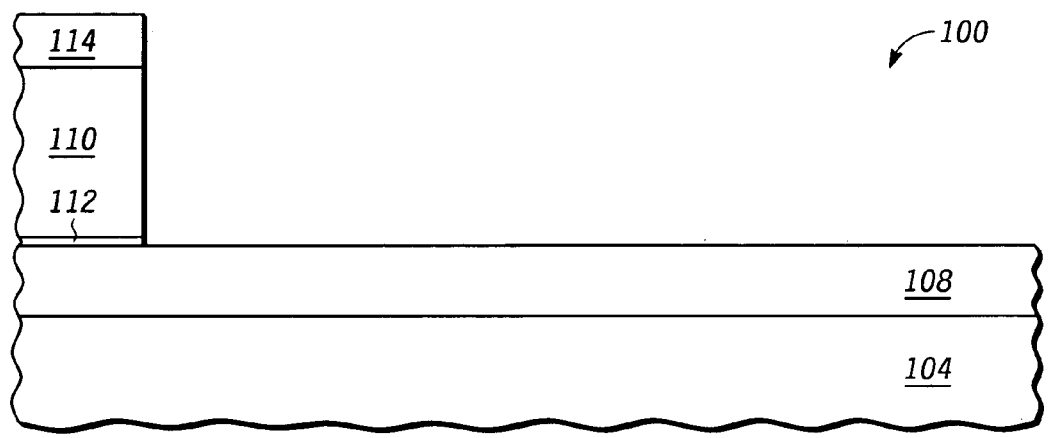
FIG. 1 is a partial cross sectional view of a semiconductor wafer at a first selected stage of one embodiment of a fabrication process according to the present invention in which a gate electrode is formed overlying a substrate.

Referring now to the drawings, a sequence of partial cross sectional views of a semiconductor wafer are presented reflecting selected stages of a fabrication process according to one embodiment of the present invention. In FIG. 1, a wafer 100 is depicted at a first selected stage of a fabrication process according to the present invention. In the depicted embodiment, wafer 100 is a silicon-on-insulator (SOI) wafer that includes a silicon layer 108 overlying a buried oxide (BOX) layer 104. BOX layer 104 is likely overlying a silicon bulk region (not depicted) of wafer 100. Silicon layer 108 is preferably single crystal silicon having a thickness of approximately 700 Angstroms and BOX layer 104 is preferably a silicon oxide compound such as silicon dioxide having a thickness of approximately 1400 Angstroms.

As depicted in FIG. 1, wafer 100 includes a gate structure overlying silicon layer 108. The gate structure includes a gate dielectric 112 overlying silicon layer 108, a conductive gate electrode 110 overlying gate dielectric 112, and a capping layer 114 overlying gate electrode 110. In one embodiment, gate dielectric 112 is a silicon oxide compound such as thermally formed silicon dioxide and gate electrode 110 is a conventional polysilicon gate electrode. In other embodiments, gate dielectric 112 may include a "high-K" dielectric material (i.e., a dielectric having a dielectric constant greater than the dielectric constant of silicon dioxide) such as hafnium oxide (HfO) while gate electrode 110 may include one or more metal materials such as titanium, tantalum, and alloys thereof. Capping layer 114 preferably provides an antireflective coating (ARC) over gate electrode 110. In one such embodiment, capping layer 114 (also referred to herein as ARC 114) is a silicon nitride film.

Figure 2:
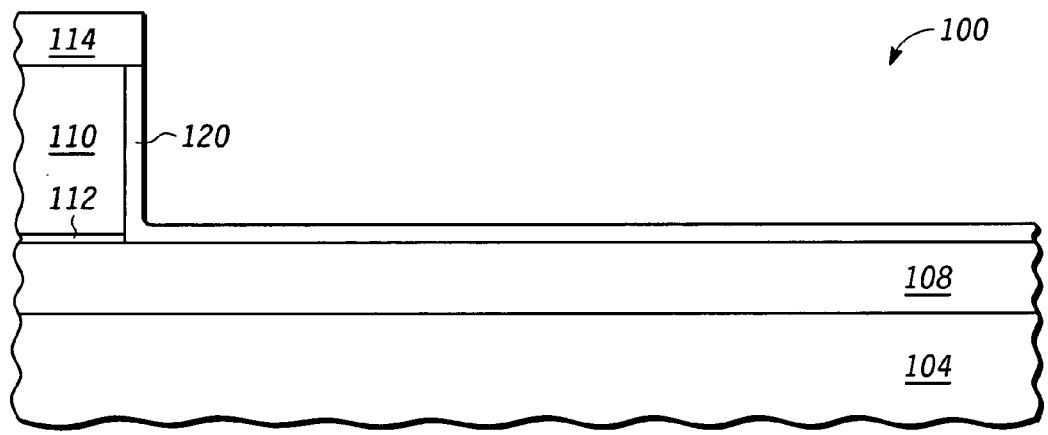
FIG. 2 depicts processing subsequent to FIG. 1 in which a first oxide liner is formed.

Referring now to FIG. 2, the elevated source/drain processing according to the present invention is initiated by forming a liner dielectric 120 on the exterior of gate electrode 110 and the upper surface of silicon layer 108. In one embodiment, liner dielectric 120 is a relatively thin silicon oxide liner of approximately 23 Angstroms formed by thermally oxidizing polysilicon gate electrode 110 (and silicon layer 108).

Figure 3:
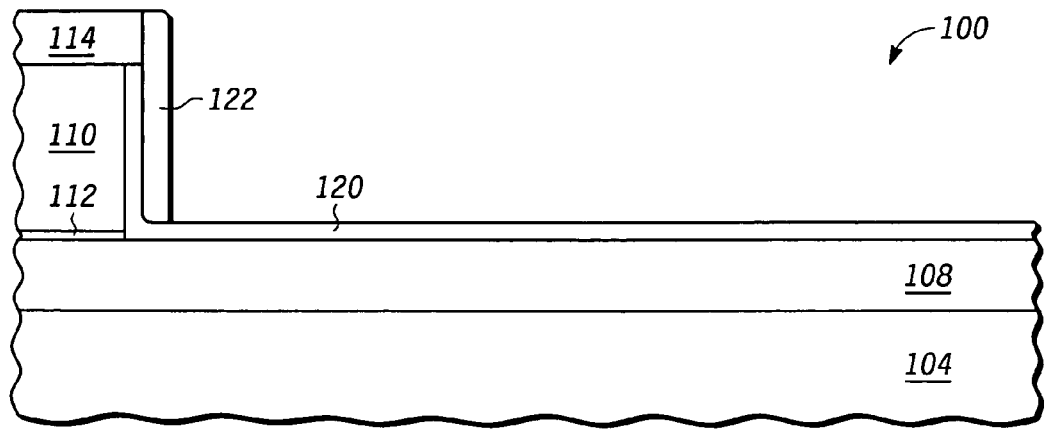
FIG. 3 depicts processing subsequent to FIG. 2 in which an offset spacer is formed adjacent the first oxide liner.

Referring to FIG. 3, a relatively thin dielectric spacer referred to herein as offset spacer 122 is formed on the sidewall of liner dielectric 120 adjacent the sidewalls of gate electrode 110. In one embodiment, offset spacer 122 is formed by depositing silicon nitride on wafer 100 using a CVD reactor and thereafter anisotropically etching the deposited film to leave silicon nitride on vertically oriented surfaces such as the sidewalls of liner dielectric 120 while removing the silicon nitride from horizontally oriented surfaces such as the upper surface of liner dielectric 120 over silicon layer 108. In the depicted embodiment, offset spacer 122 contacts ARC 114 and thereby beneficially encloses or surrounds gate electrode 110 in silicon nitride to provide a protective barrier for the gate electrode during subsequent processing and, more specifically, during subsequent silicon formation processing. In one embodiment, a 150 Angstrom thick layer of silicon nitride is deposited and etch to form offset spacer 122.

Figure 4:
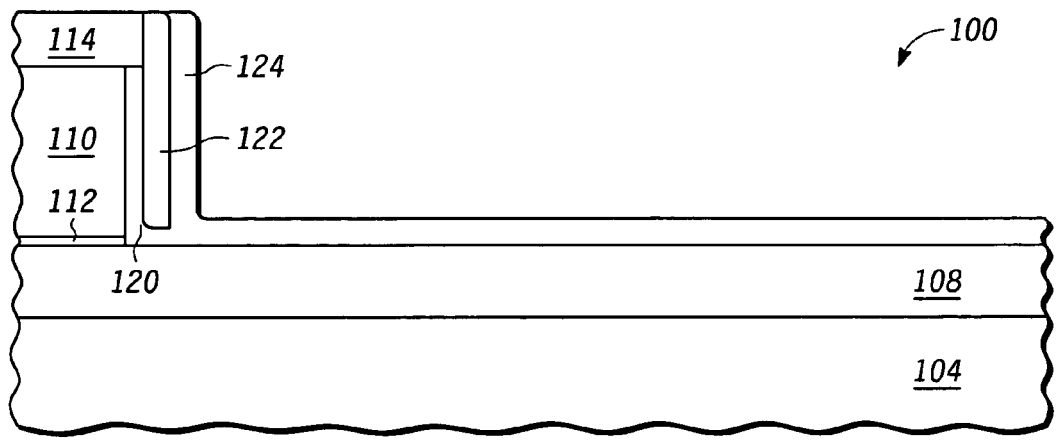
FIG. 4 depicts processing subsequent to FIG. 3 in which a second oxide liner is formed.

In FIG. 4, a second liner dielectric 124 is formed on the sidewalls of offset spacer 122 and the upper surface of (first) liner dielectric 120. (Because liner dielectrics 120 and 124 are preferably both silicon oxide compounds, the film is shown with a single reference numeral 124 overlying the silicon layer 108). In one implementation, second liner dielectric 124 is a CVD silicon-oxide film preferably having a thickness of approximately 150 Angstroms. For embodiments in which first liner dielectric 120 is a thermally formed oxide and second liner dielectric is a CVD oxide, it will be appreciated that the etch rate of first liner dielectric 120 in HF solution is significantly less than the etch rate of second dielectric 124. The slower etch rate of first liner dielectric 120 will ensure that first liner dielectric 120 beneficially remains intact during subsequent processing to protect the gate electrode and provide mechanical support for the offset spacer 122.

Figure 5:
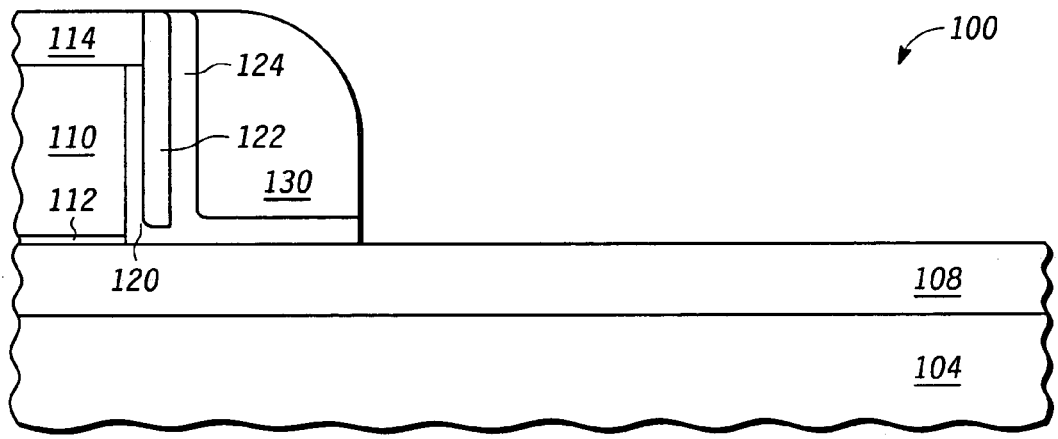
FIG. 5 depicts processing subsequent to FIG. 4 in which a disposable spacer is formed.

In FIG. 5, a spacer, referred to herein as disposable spacer 130, has been formed on the sidewalls of second liner dielectric 124 adjacent the offset spacer 122. In the preferred embodiment, disposable spacer is a silicon nitride spacer formed by depositing approximately 900 Angstroms of silicon nitride followed by an anisotropic silicon nitride etch. Disposable spacer 130 may then be subjected to a rapid thermal anneal (e.g., 5 seconds at 1060° C.) to "densify" the as-deposited silicon nitride. Disposable spacer 130 (in conjunction with capping layer 114 and offset spacer 122) serves as a mask that defines the portions of the underlying silicon wafer 108 on which an elevated source/drain structure will be formed.

As depicted in FIG. 5, silicon wafer 100 beneficially incorporates disposable spacer 130 that enables the formation of elevated source/drain regions prior to shallow implant processes, such as extension and halo implant processes, that would be negatively impacted by the high temperature process required to form the elevated source/drain epitaxially. In addition, the inclusion of the offset spacer 122 and ARC 114 protects gate electrode 110 during the high temperature silicon formation process thereby preventing the formation of so-called mouse ears at the corners of the gate electrode. Thus, wafer 100 as depicted in FIG. 5 is suitable for be subjected to an epitaxial or other high temperature, silicon formation process, such as an elevated source/drain formation process sequence, without jeopardizing the physical dimensions of the gate electrode structure.

Whereas conventional processes that form elevated source/drain structures prior to shallow implants typically form a nitride spacer, analogous to spacer 130, directly on a very thin oxide liner that is in contact with the silicon gate electrode may exhibit significant and unwanted silicon formation on the gate electrode during epitaxial processing, the presently described invention promotes superior repeatability and reliability by providing better protection of the gate electrode. The gate electrode 110 of the present invention is sealed within a silicon nitride enclosure formed when offset spacer 122 is formed in contact with ARC 114. In addition, as described below, offset spacer 122 provides a good etch stop during subsequent etch processing and a desirable offset spacer for shallow implants.

Figure 6:
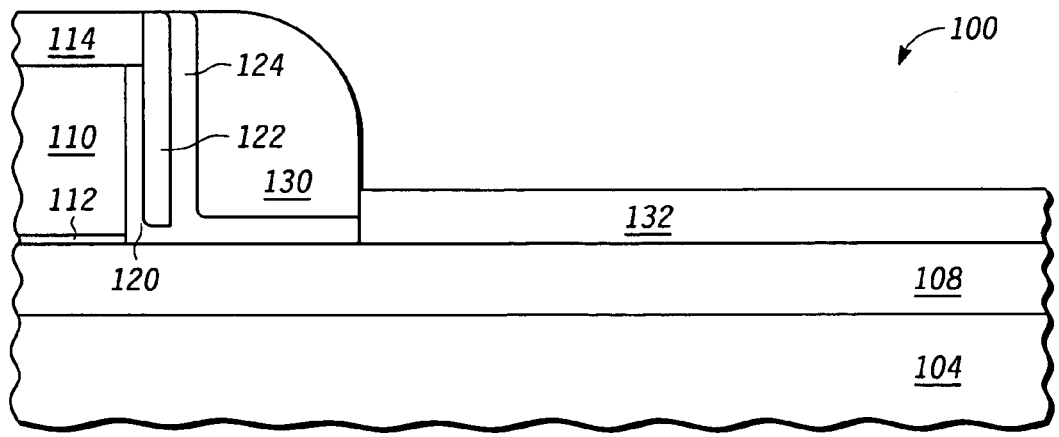
FIG. 6 depicts processing subsequent to FIG. 5 in which an elevated source/drain is formed.

Turning now to FIG. 6, an elevated silicon layer 132 is formed overlying the exposed portions of silicon layer 108 (i.e., the portions of silicon layer 108 covered by neither gate electrode 110 nor disposable spacer 130). The preferred embodiment of forming elevated source/drain layer 132 includes epitaxial growth of elevated source/drain layer 132 using a silicon-chloride source such as $SiHCL_3$ at a temperature in excess of 1000° C. A thickness of elevated source/drain layer 132 in one implementation is in the range of approximately 200 to 300 Angstroms. The presence of disposable spacer 130 during the epitaxial processing prevents formation of the epitaxial layer below the spacer. Similarly, the presence of offset spacer 122 and ARC 114 prevent the epitaxial processing from affecting the profile of gate electrode 110. In one embodiment, following the formation of elevated source/drain 132, a thin (i.e., less than 25 Angstroms) layer of oxide is thermally grown overlying elevated source/drain 132. This thin oxide, which is subsequently stripped, is a sacrificial layer that consumes contaminants and imperfections at the upper surface of the epitaxial film.

Figure 7:
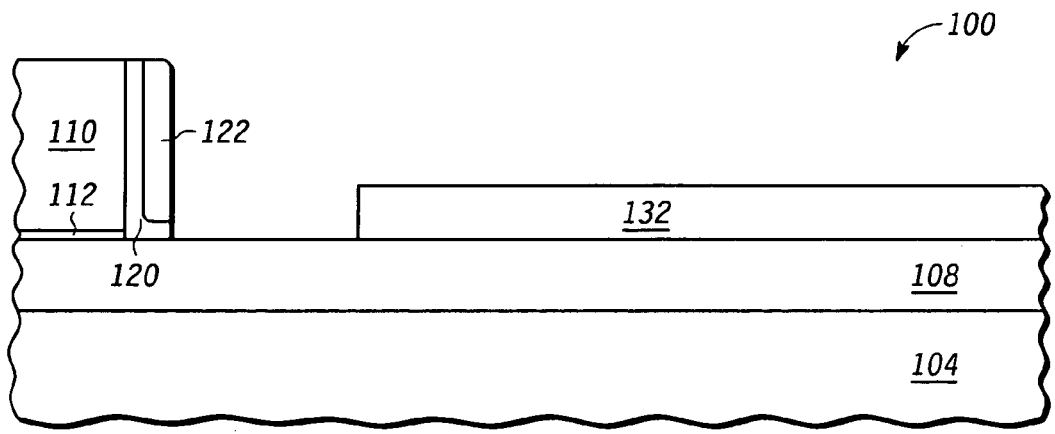
FIG. 7 depicts processing subsequent to FIG. 6 in which the disposable spacer and the second oxide liner are removed.

Referring now to FIG. 7, following completion of elevated source/drain region 132, disposable spacer 130 and second liner dielectric 124 are removed without removing offset spacer 122 to expose portions of silicon layer 108 in close proximity to gate electrode 110 (displaced laterally from gate electrode 110 only by the combined thickness of liner 120 and offset spacer 122). Disposable spacer 130 is preferably removed by dipping wafer 100 in a phosphoric acid solution heated to 180° C. while second liner dielectric 124 is removed with an HF dip or another suitable etching process. If the HF is properly controlled, the thermally formed first liner dielectric 120 underlying offset spacer 122 will remain intact after CVD second liner dielectric 124 is removed due to differences in their respective etch rates in HF.

The oxide-nitride-oxide-nitride layering of liner 120, spacer 122, liner 124, and spacer 130 enables the separate removal of each film thereby facilitating the removal of disposable spacer 130 without affecting offset spacer 122. The presence of offset spacer 122 beneficially protects the sidewalls of gate electrode 110 during removal of second liner dielectric 124. For embodiments in which ARC 114 and disposable spacer 130 are both silicon nitride, the removal of disposable spacer 130 also removes ARC 114 (as seen in FIG. 7). The removal of spacer 130 and liner 124 exposes the upper surface of silicon layer 108 proximal to gate electrode 110.

Figure 8:
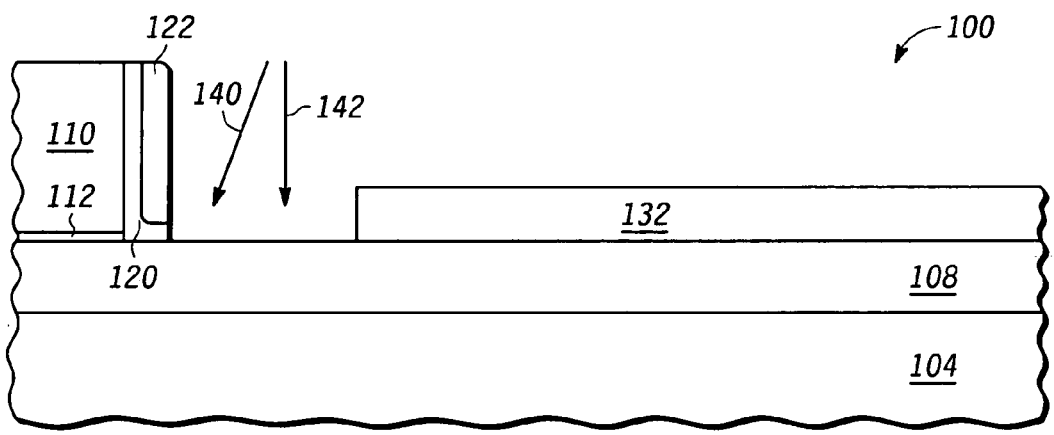
FIG. 8 depicts processing subsequent to FIG. 7 in which shallow implants are performed.

Referring now to FIG. 8, shallow implants including a halo implant represented by reference numeral 140 and an extension implant represented by reference numeral 142 are performed. Halo implant 140 is a angled implant that introduces an impurity of the same species as the well region in which it is introduced. Extension implant 142 introduces an opposite type impurity into each well region. Thus, for NMOS transistors (on P-wells), Halo implant 140 is a P-type dopant such as boron while extension implant 142 is an N-type dopant such as phosphorous or arsenic. The presence of offset spacer 122, which has a thickness of approximately 100 Angstroms during the shallow implants is beneficial in optimizing the location of the implanted impurity distributions relative to gate electrode 110 and the underlying transistor channel.

Figure 9:
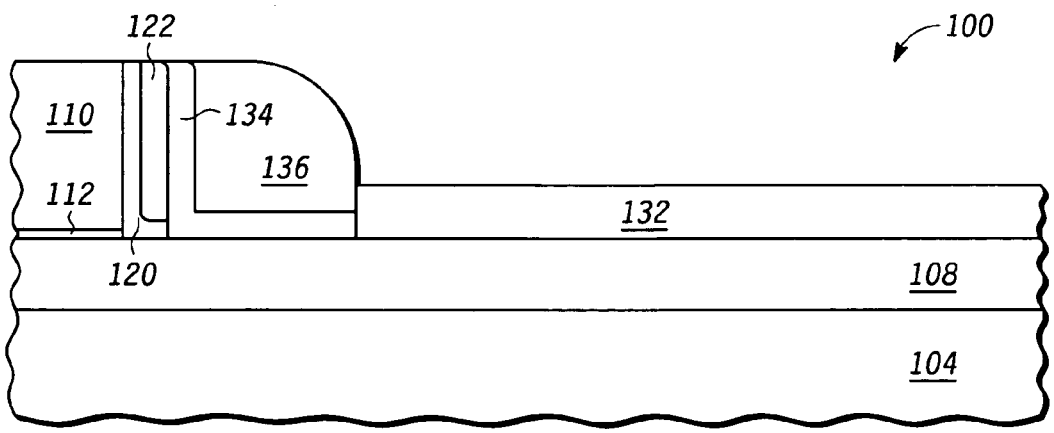
FIG. 9 depicts processing subsequent to FIG. 8 in which a replacement oxide liner and a replacement spacer are formed where the disposable spacer previously existed.

Referring now to FIG. 9, following the shallow implants, a third liner dielectric 134 and a replacement spacer 136 are formed where disposable spacer 130 and line 124 existed previously to cover the portion of silicon layer 108 exposed when the disposable spacer was removed. In one embodiment, the formation of liner 134 and spacer 136 is substantially equivalent to the formation of second liner dielectric 124 and disposable spacer 130. In this embodiment, therefore, third liner dielectric 134 is a silicon oxide layer while replacement spacer 136 is silicon nitride.

Figure 10:
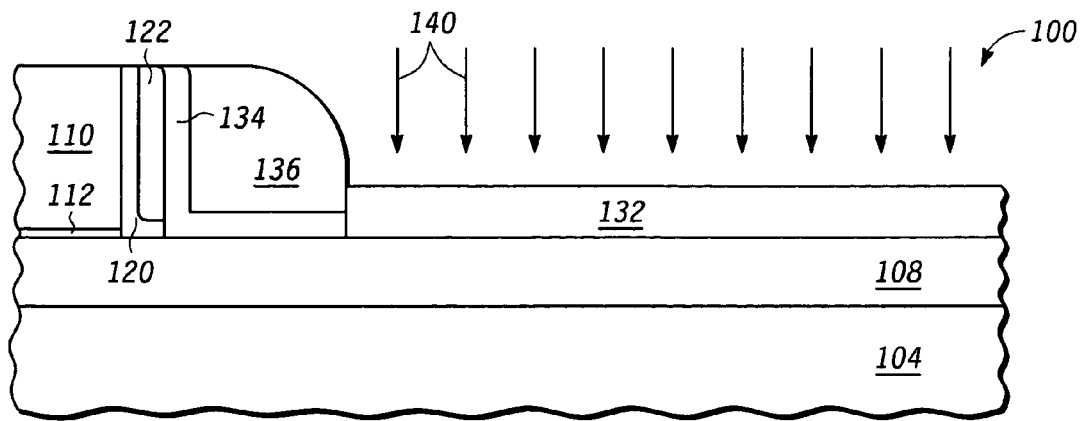
FIG. 10 depicts processing subsequent to FIG. 9 in which a source/drain implant is introduced into the elevated source/drain.

Referring to FIG. 10, a source/drain implant represented by reference numeral 140 is performed to introduce a source/drain impurity distribution having a relatively high impurity concentration into elevated source/drain 132. For NMOS transistors, source/drain implant 140 is an N-type dopant such as arsenic or phosphorous while a P-type dopant is used for PMOS transistors. A rapid thermal anneal process may be performed following source/drain implant 140 to activate the implanted species. A likely embodiment of this anneal would expose the wafer 100 to a temperature of approximately 1000° C. for a duration of approximately 5 seconds.

Figure 11:
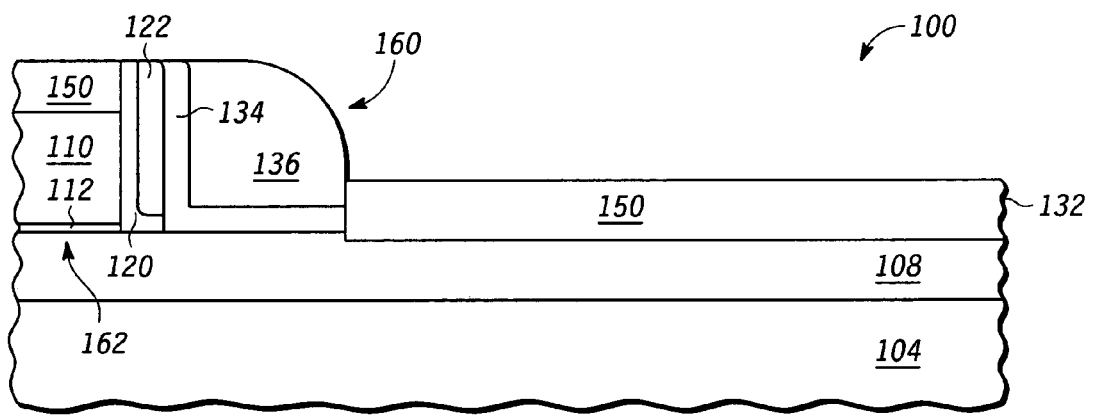
FIG. 11 depicts processing subsequent to FIG. 10 in which the gate electrode and source/drain regions are silicided.

Referring now to FIG. 11, silicide processing of wafer 100 is performed by depositing a metal such as cobalt that is reactive with silicon over wafer 100. The wafer is then heated to react the metal with silicon (where the metal overlies silicon) to form silicide structures identified by reference numeral 150 in a manner that will be familiar to those skilled in semiconductor wafer fabrication. Silicide 150 forms overlying the elevated source/drain region 130 as well as overlying silicon gate 110. In the depicted embodiment, the silicide 150 extends entirely through the elevated source/drain 132 and partially into the underlying silicon layer 108.

The resulting transistor 160 includes a gate electrode 110 overlying a transistor channel region 162. A silicided and elevated source/drain region is laterally displaced from gate electrode 110. An offset spacer 122 and a replacement spacer 136, both comprised of silicon nitride are located between gate electrode 110 and elevated source/drain 132. A first liner oxide 120 is located between offset spacer 122 and gate electrode 110 while the third liner oxide 134 is positioned between offset spacer 122 and replacement spacer 136.

In the foregoing specification, the invention has been described with reference to specific embodiments. However, one of ordinary skill in the art appreciates that various modifications and changes can be made without departing from the scope of the present invention as set forth in the claims below. As examples, the specified thickness for the various films and the source gas for the epitaxial formation of elevated source/drain 132 may be different than those specified herein. Another example of an alternative is to substitute a different metal for the suicide processing described with respect to FIG. 11. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A semiconductor fabrication process comprising:
   forming a gate electrode overlying a substrate;
   forming an oxide liner on sidewalls of the gate electrode;
   forming an offset spacer of silicon nitride adjacent the oxide liner;
   forming an intermediate liner of silicon oxide adjacent the offset spacer;
   forming a disposable spacer of silicon nitride adjacent the intermediate liner;
   forming an elevated source/drain overlying the substrate and displaced laterally from sidewalls of the gate electrode by the disposable spacer;
   following forming the elevated source/drain removing the intermediate oxide liner and the disposable spacer to expose the upper surface of the substrate and implanting halo and extension implants into the exposed substrate;
   following performing the halo and extension implants, forming a replacement intermediate oxide liner and a replacement spacer located substantially where the original intermediate oxide liner and disposable spacer were located; and
   forming an antireflective coating (ARC) of silicon nitride overlying the gate electrode.

2. The process of claim 1, wherein the offset spacer contacts the ARC to enclose the gate electrode in silicon nitride.

3. A semiconductor fabrication process comprising:
   forming a gate electrode overlying a substrate;
   forming an oxide liner on sidewalls of the gate electrode;
   forming an offset spacer of silicon nitride adjacent the oxide liner;
   forming an intermediate liner of silicon oxide adjacent the offset spacer;
   forming a disposable spacer of silicon nitride adjacent the intermediate liner;
   forming an elevated source/drain overlying the substrate and displaced laterally from sidewalls of the gate electrode by the disposable spacer;
   following forming the elevated source/drain removing the intermediate oxide liner and the disposable spacer to expose the upper surface of the substrate and implanting halo and extension implants into the exposed substrate; and following performing the halo and extension implants, forming a replacement intermediate oxide liner and a replacement spacer located substantially where the original intermediate oxide liner and disposable spacer were located.

4. The process of claim 3, wherein forming the gate electrode includes forming a silicon nitride capping layer overlying a polysilicon gate electrode.

5. The process of claim 4, wherein the first silicon nitride spacer contacts the capping layer to surround the polysilicon gate electrode in silicon nitride.

6. The process of claim 3, wherein the first silicon nitride spacer is formed from a silicon nitride film having a thickness of approximately 150 Angstroms.

7. The process of claim 6, wherein the disposable silicon nitride spacer is formed from a silicon nitride film having a thickness of approximately 900 Angstroms.

8. The process of claim 3, further comprising rapid thermally annealing the wafer following formation of the disposable spacer by exposing the wafer to an ambient maintained at a temperature of approximately 1060° C. for a duration of approximately 5 seconds.

9. The process of claim 3, further comprising depositing cobalt over the wafer following the source/drain implant and heating the wafer to react the cobalt where it contacts silicon including silicon in the elevated source/drain and silicon in the gate electrode.

10. The process of claim 3, further comprising, following formation of the replacement spacer, performing a source/drain implant to introduce a source/drain impurity distribution into the elevated source/drain.

11. The process of claim 3, wherein forming the elevated source/drain includes epitaxial formation of the elevated source/drain at a temperature of at least 1000° C.

12. A semiconductor fabrication process, comprising:
forming a gate electrode overlying a substrate;
forming an oxide liner on sidewalls of the gate electrode;
forming a silicon nitride offset spacer adjacent the oxide liner;
forming an intermediate liner of silicon oxide adjacent the offset spacer;
forming a disposable silicon nitride spacer adjacent the offset spacer;
forming an elevated source/drain structure overlying regions of the substrate not protected by the gate electrode or the disposable spacer;
without removing the offset spacer, removing the disposable spacer and the intermediate oxide liner to expose the substrate proximal to the gate electrode;
implanting an impurity distribution into the exposed substrate proximal the gate electrode;
forming a replacement intermediate oxide liner and a replacement spacer substantially where the intermediate liner and the disposable spacer existed; and
after forming the replacement spacer, performing a source/drain implant to introduce a source/drain impurity distribution into the elevated source drain.

* * * * *